(12) United States Patent
Shimizu et al.

(10) Patent No.: US 11,795,396 B2
(45) Date of Patent: Oct. 24, 2023

(54) DRY ETCHING GAS COMPOSITION COMPRISING SULFUR-CONTAINING FLUOROCARBON COMPOUND HAVING UNSATURATED BOND AND DRY ETCHING METHOD USING THE SAME

(71) Applicant: KANTO DENKA KOGYO CO., LTD., Tokyo (JP)

(72) Inventors: Hisashi Shimizu, Gunma (JP); Korehito Kato, Gunma (JP)

(73) Assignee: KANTO DENKA KOGYO CO., LTD., Tokyo (JP)

( * ) Notice: Subject to any disclaimer, the term of this patent is extended or adjusted under 35 U.S.C. 154(b) by 0 days.

(21) Appl. No.: 17/577,511

(22) Filed: Jan. 18, 2022

(65) Prior Publication Data

US 2022/0135881 A1    May 5, 2022

Related U.S. Application Data

(62) Division of application No. 17/288,248, filed as application No. PCT/JP2019/041824 on Oct. 25, 2019.

(30) Foreign Application Priority Data

Oct. 26, 2018 (JP) ................... 2018-202091

(51) Int. Cl.
    *H01L 21/3065* (2006.01)
    *C09K 13/00* (2006.01)
(52) U.S. Cl.
    CPC .......... *C09K 13/00* (2013.01); *H01L 21/3065* (2013.01)

(58) Field of Classification Search
    None
    See application file for complete search history.

(56) References Cited

U.S. PATENT DOCUMENTS 5,376,234 A     12/1994  Yanagida
2016/0307764 A1*  10/2016  Gupta ............... H01L 21/32137
(Continued)

FOREIGN PATENT DOCUMENTS

| JP | H0613351 A | | 1/1994 |
| JP | 2016149451 A | | 8/2016 |
| KR | 2001-0010568 A | * | 2/2001 |

(Continued)

OTHER PUBLICATIONS

International Search Report of PCT/JP2019/041824, dated Dec. 24, 2019.

(Continued)

*Primary Examiner* — Shamim Ahmed
(74) *Attorney, Agent, or Firm* — BROWDY AND NEIMARK, PLLC

(57) ABSTRACT

Provided is a novel etching gas composition that comprises a sulfur-containing unsaturated compound and that is useful for etching a stacked structure of silicon-based films. A dry etching gas composition comprises a sulfur-containing fluorocarbon compound that has an unsaturated bond and that is represented by general formula (1) of $C_xF_yS_z$ where x, y, and z are $2 \leq x \leq 5$, $y \leq 2x$, and $1 \leq z \leq 2$.

18 Claims, 5 Drawing Sheets

Etching Rate (top: C4F6, bottom: C4F6S) *CN is an average of SiO2 and SiN

(56) References Cited

U.S. PATENT DOCUMENTS

2018/0182777 A1* 6/2018 Cui .................. H01L 21/31122
2019/0148167 A1* 5/2019 Kim ................. H01L 21/32139
   252/79

FOREIGN PATENT DOCUMENTS

KR      100574923 A     2/2001
KR     20010010568 A    2/2001
WO      2015035381 A1   3/2015

OTHER PUBLICATIONS

International Search Report of PCT/JP2019/041827, dated Dec. 24, 2019.

* cited by examiner

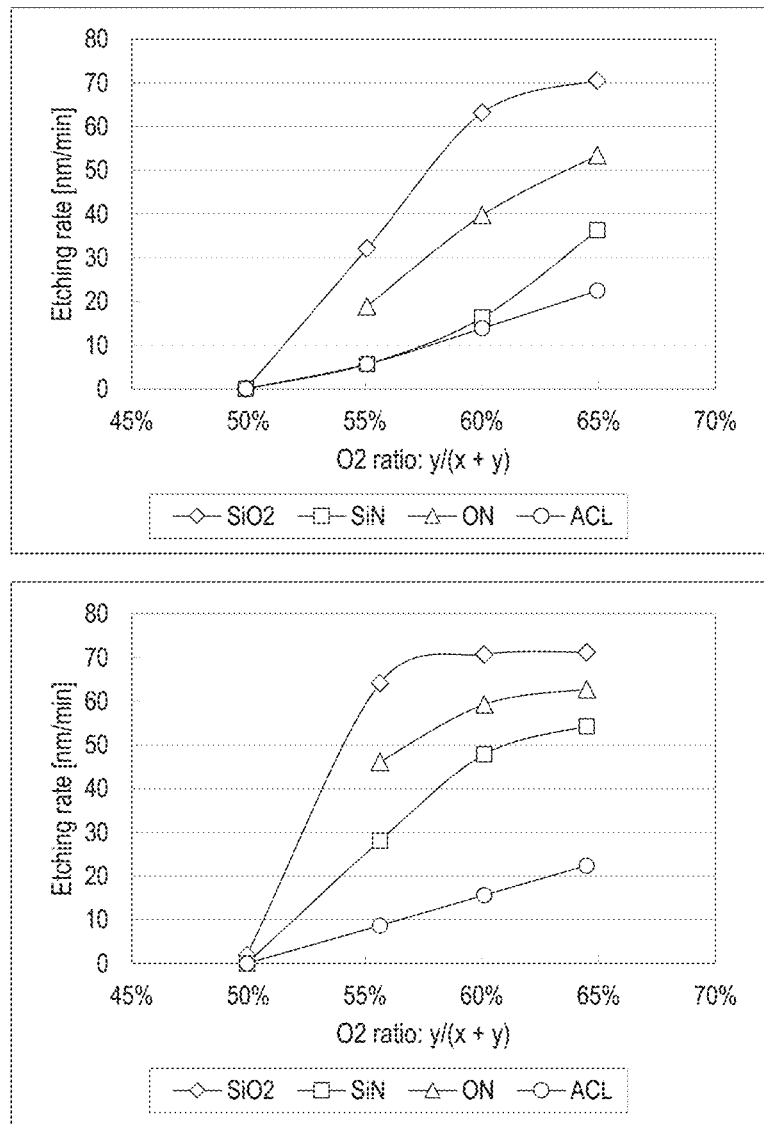
FIG. 1 Etching Rate (top: C4F6, bottom: C4F6S) *ON is an average of SiO2 and SiN

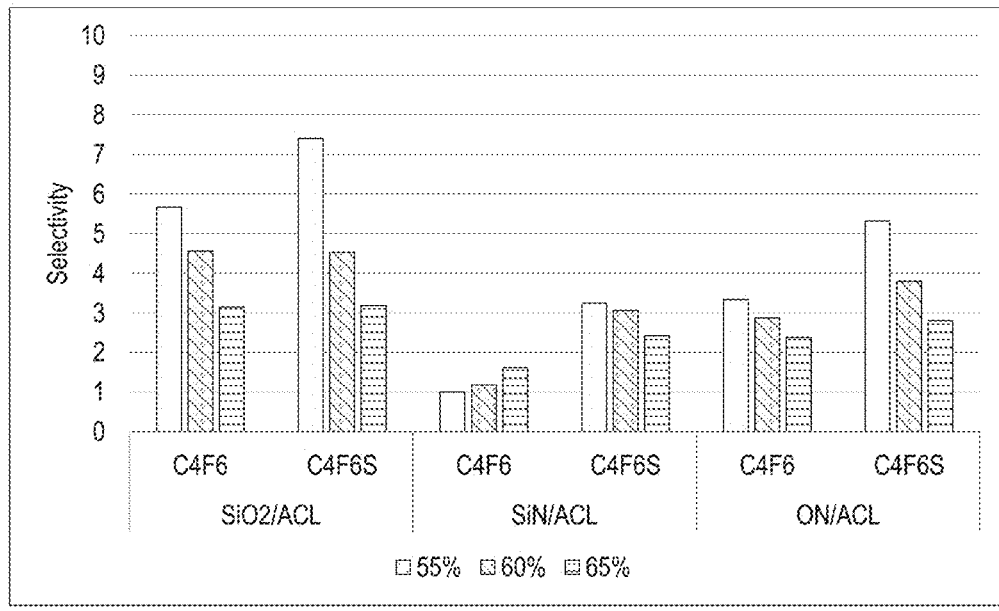
FIG. 2  Selectivity over ACL (left: C4F6, right: C4F6S)
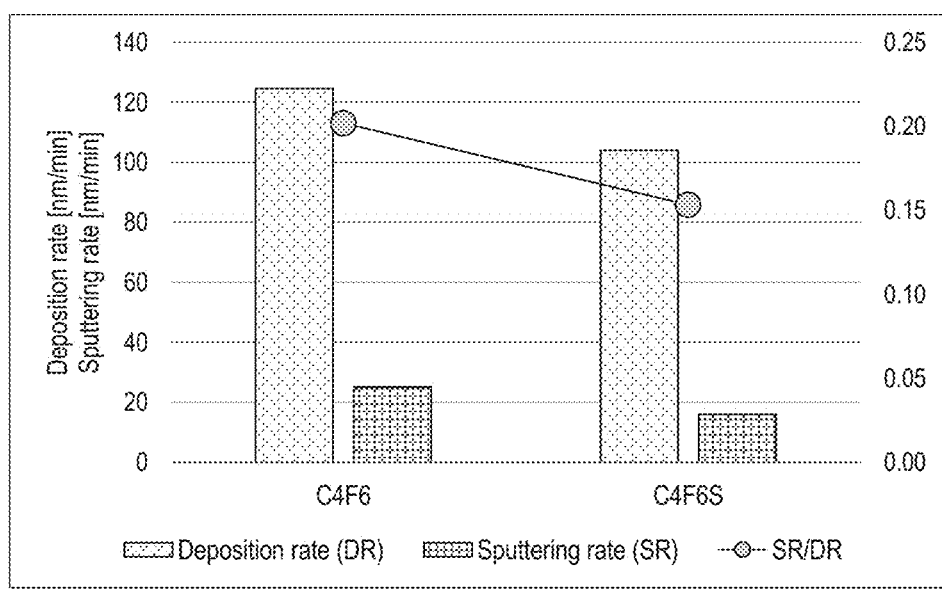
FIG. 3  Deposition Rate and Sputtering Rate

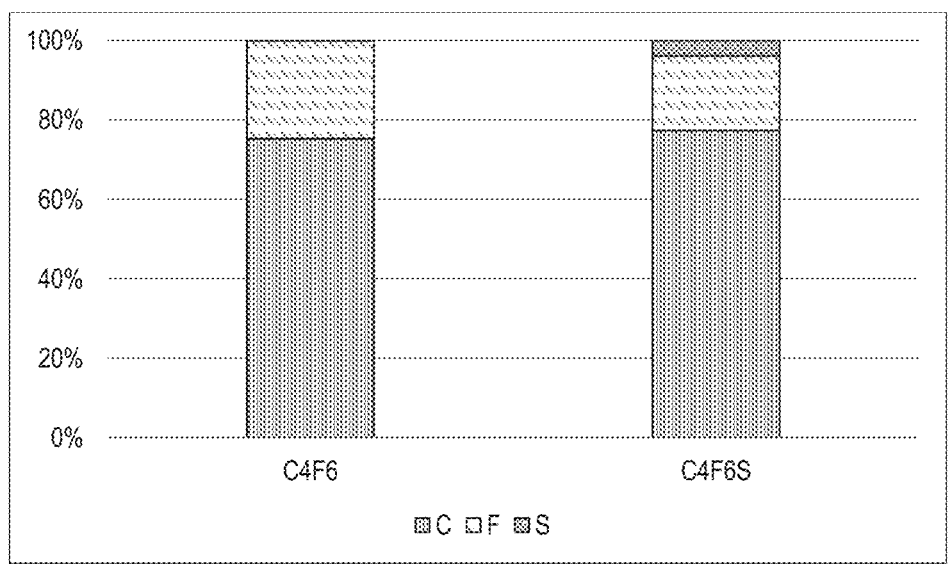
FIG. 4 Compositional Analysis (SEM-EDX)

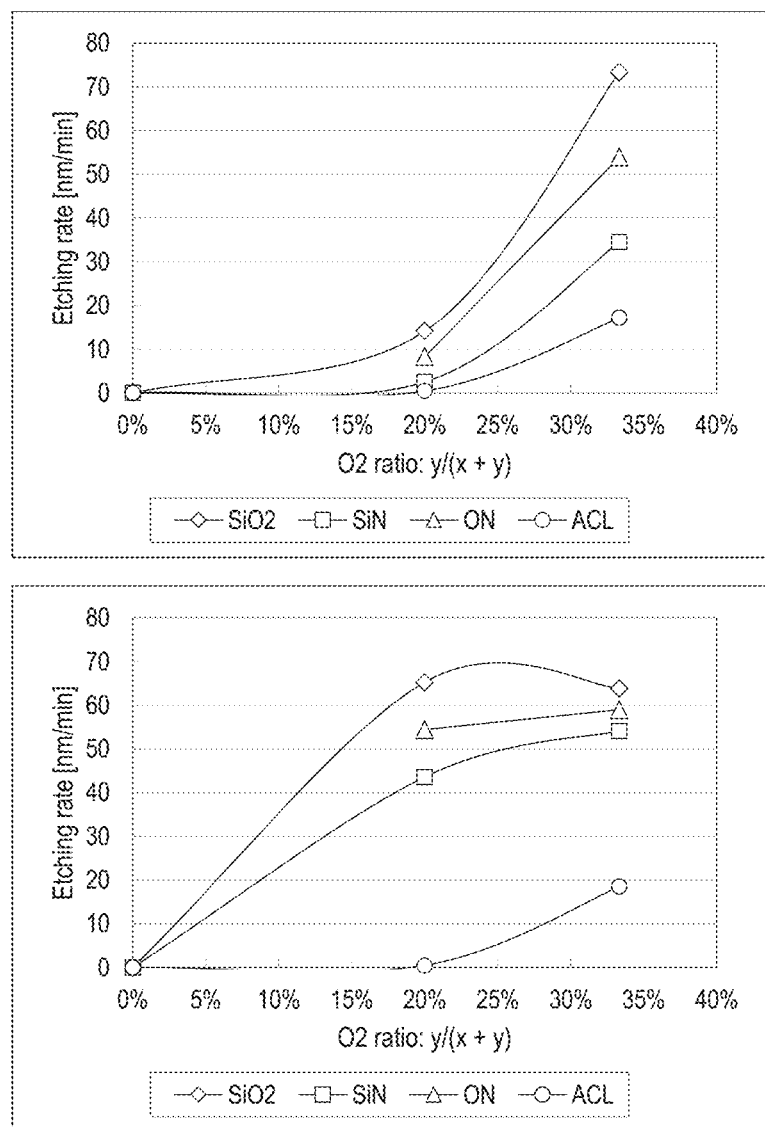
FIG. 5 Etching Rate (top: C3F6, bottom: C3F6S)

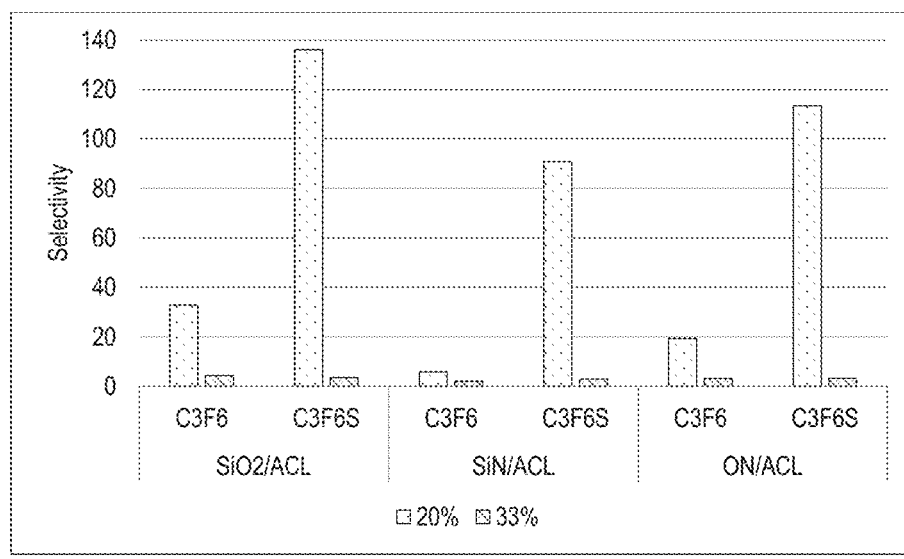
FIG. 6 Selectivity over ACL (left: C3F6, right: C3F6S)

DRY ETCHING GAS COMPOSITION COMPRISING SULFUR-CONTAINING FLUOROCARBON COMPOUND HAVING UNSATURATED BOND AND DRY ETCHING METHOD USING THE SAME

TECHNICAL FIELD

The present invention relates to a dry etching gas composition comprising a sulfur-containing fluorocarbon compound and to a dry etching method using the composition.

BACKGROUND ART

Along with the shift towards miniaturization and 3D configurations of semiconductor devices, the needs for an etching process have become increasingly demanding year after year. Particularly in collective etching of a stacked $SiO_2$ and polysilicon (poly-Si) structure, collective etching of a stacked $SiO_2$ and SiN structure, or $SiO_2$ etching typical for the application to memories, etching characteristics, such as high-speed etching for improved throughput, high selectivity over masks, and satisfactory processed shapes (suppressed necking and bowing, vertical shapes, and so forth) are needed.

Concerning a dry etching gas composition comprising a sulfur-containing fluorocarbon compound having an unsaturated bond, Patent Literature (PTL) 1 describes a dry etching method using a sulfur-containing unsaturated compound (perfluoropropylene sulfide ($C_3F_6S$)). However, PTL 1 relates to the application characterized by the ratio of silicon oxide to silicon nitride removed through etching (application to $SiO_2$/SiN selective etching) and does not describe the application characterized by selective etching of silicon oxide and silicon nitride over an amorphous carbon layer (ACL) or the application characterized by selective etching of silicon oxide and polycrystalline silicon over an amorphous carbon layer (ACL). PTL 2 describes a dry etching method using specific sulfur-containing compounds, but all the sulfur-containing compounds are saturated compounds.

CITATION LIST

Patent Literature

PTL 1: Korean Patent No. 10-0574923 (Korean Unexamined Publication No. 10-2001-0010568)
PTL 2: WO 2015/035381

SUMMARY OF INVENTION

Technical Problem

An object of the present invention is to provide a novel etching gas composition that comprises a sulfur-containing unsaturated compound and that is useful for the application to the etching of a silicon-based film stacked structure.

Solution to Problem

According to the present invention, the following are provided.

[1] A dry etching gas composition comprising a sulfur-containing fluorocarbon compound that has an unsaturated bond and that is represented by general formula (1) of $C_xF_yS_z$ where x, y, and z are $2 \leq x \leq 5$, $y \leq 2x$, and $1 \leq z \leq 2$.

[2] The dry etching gas composition according to [1], where the sulfur-containing fluorocarbon compound is at least one selected from 2,2,3,4,5,5-hexafluoro-2,5-dihydrothiophene ($C_4F_6S$) and trifluorovinyl trifluoromethyl thioether ($C_3F_6S$).

[3] The dry etching gas composition according to [1] or [2], comprising the sulfur-containing fluorocarbon compound in an amount of 1 to 100 vol %.

[4] The dry etching gas composition according to any one of [1] to [3], further comprising, in addition to the sulfur-containing fluorocarbon compound, at least one oxygen-containing compound selected from the group consisting of $O_2$, $O_3$, CO, $CO_2$, NO, $NO_2$, $SO_2$, and $SO_3$.

[5] The dry etching gas composition according to any one of [1] to [4], further comprising, in addition to the sulfur-containing fluorocarbon compound, at least one inert gas selected from the group consisting of $N_2$, He, Ar, Ne, and Xe.

[6] A dry etching method comprising etching a silicon-containing deposit or film by plasma etching using the dry etching gas composition according to any one of [1] to [5].

[7] The dry etching method according to [6], where the silicon-containing deposit or film is a deposit or film further containing oxygen and/or nitrogen.

[8] The dry etching method according to [6] or [7], comprising selectively etching the silicon-containing deposit or film over a mask material.

[9] A dry etching method comprising plasma etching, by using the dry etching gas composition according to any one of [1] to [5], a stacked structure of: (a1) carbon-containing silicon-based film, (a2) a single crystal silicon film, (a3) an amorphous silicon film, (a4) a polycrystalline silicon film (polysilicon film), (a5) a silicon oxynitride film, (a6) an amorphous carbon film, and/or (a7) a photoresist film; and (b1) a silicon oxide film and/or (b2) a silicon nitride film, thereby selectively etching (b1) the silicon oxide film and/or (b2) the silicon nitride film of the stacked structure.

[10] The dry etching method according to [9], where the stacked structure contains (b1) the silicon oxide film and (b2) the silicon nitride film; and the method selectively etches (b1) the silicon oxide film over (b2) the silicon nitride film.

[11] A dry etching method comprising plasma etching, by using the dry etching gas composition according to any one of [1] to [5], a stacked structure of: (a1) carbon-containing silicon-based film, (a2) a single crystal silicon film, (a3) an amorphous silicon film, (a4) a silicon nitride film, (a5) a silicon oxynitride film, (a6) an amorphous carbon film, and/or (a7) a photoresist film; and (b1) a silicon oxide film and/or (b2) a polycrystalline silicon film (polysilicon film), thereby selectively etching (b1) the silicon oxide film and/or (b2) the polycrystalline silicon film (polysilicon film) of the stacked structure.

[12] The dry etching method according to any one of [6] to [11], where etching is performed by generating a plasma of the etching gas composition according to any one of [1] to [5] to form S-containing ions or active species.

[13] The dry etching method according to any one of [6] to [11], where etching by the dry etching gas composition according to any one of [1] to [5] is performed under plasma conditions that enable simultaneous etching of (b1) a silicon oxide film and (b2) a silicon nitride film.

Advantageous Effects of Invention

The present invention provides an etching gas composition having a high ratio of a material containing silicon oxide and silicon nitride to an amorphous carbon layer (ACL) that are removed through etching. Accordingly, by using the etching gas composition of the present invention, a method of accurately etching a material containing silicon oxide and silicon nitride using an amorphous carbon layer as a mask is provided.

BRIEF DESCRIPTION OF DRAWINGS

FIG. 1 shows the results of etching test (1).
FIG. 2 is a bar graph showing the results of etching test (1) relative to the etching rate of ACL.
FIG. 3 shows the results of a deposit film evaluation test.
FIG. 4 shows the composition of each deposit film formed in the deposit film evaluation test.
FIG. 5 shows the results of etching test (2).
FIG. 6 is a bar graph showing the results of etching test (2) relative to the etching rate of ACL.

DESCRIPTION OF EMBODIMENTS

Hereinafter, a dry etching gas composition and a dry etching method using the composition in the present invention will be described in detail. The scope of the present invention, however, is not limited to the scope described hereinafter and may be modified without departing from the spirit of the present invention.

The dry etching gas composition in the present invention encompasses a mixed gas of a sulfur-containing fluorocarbon compound that has an unsaturated bond and that is represented by general formula (1) below or a single-component gas thereof:

$$C_xF_yS_z \quad \text{General formula (1):}$$

where x, y, and z are $2 \leq x \leq 5$, $y \leq 2x$ and $1 \leq z \leq 2$.

In view of easy handling of a dry etching gas, it is preferable to use compounds satisfying x=2 to 4, y=4 to 8, and Z=1 in general formula (1). Exemplary suitable compounds include the following.

[Chem. 1]

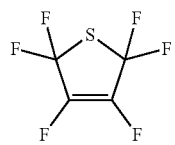

2,2,3,4,5,5-Hexafluoro-2,5-dihydrothiophene ($C_4F_6S$)

[Chem. 2]

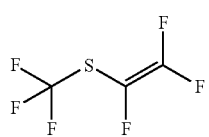

Trifluorovinyl trifluoromethyl thioether ($C_3F_6S$)

[Chem. 3]

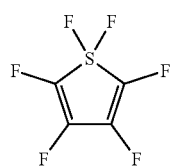

1,1,2,3,4,5-Hexafluoro-1,1-dihydrothiophene ($C_4F_6S$)

[Chem. 4]

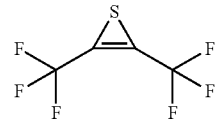

2,3-Bis(trifluoromethyl)thiirene ($C_4F_6S$)

[Chem. 5]

3,3,3-Trifluoro-2-(trifluoromethyl)-1-propene-1-thione ($C_4F_6S$)

[Chem. 6]

2,2,3,3,4,5-Hexafluoro-2,3,-dihydrothiophene ($C_4F_6S$)

[Chem. 7]

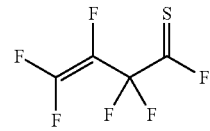

2,2,3,4,4-Pentafluoro-3-butenethioyl fluoride ($C_4F_6S$)

[Chem. 8]

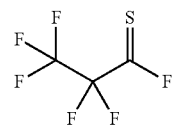

2,2,3,3,3-Pentafluoropropanethioyl fluoride ($C_3F_6S$)

[Chem. 9]

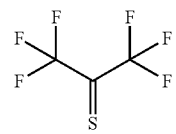

1,1,1,3,3,3-Hexafluoro-2-propanethione ($C_3F_6S$)

[Chem. 10]

1,3,3,3-Tetrafluoro-2-(trifluoromethyl)-1-propene-1-sulfenyl fluoride ($C_4F_8S$)

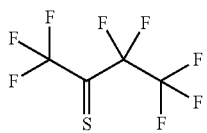

1,1,1,3,3,4,4,4-Octafluoro-2-butanethione ($C_4F_8S$)

2,3,4,5-Tetrafluorothiophene ($C_4F_4S$)

In the dry etching gas composition in the present invention, a sulfur-containing fluorocarbon compound represented by general formula (1) having a purity of 95.0 vol % to 100.0 vol % is preferably used. A sulfur-containing fluorocarbon compound having a purity of 99 vol % or more is more preferably used, and a sulfur-containing fluorocarbon compound having a purity of 99.9 vol % or more is further preferably used. Examples of impurity components contained include $N_2$, $O_2$, $CO_2$, $H_2O$, HF, HCl, $SO_2$, and $CH_4$. Among these impurity components, $H_2O$, HF, HCl, $SO_2$, and the like are highly likely to corrode distribution channels for gases and thus preferably removed as much as possible through purification.

By using a sulfur-containing fluorocarbon compound represented by general formula (1) mixed with another fluorocarbon (FC) gas or a hydrofluorocarbon (HFC) gas, the dry etching gas composition in the present invention can further enhance the selectivity of an etching target material over materials excluding the etching target material as compared with the case without incorporating a compound represented by general formula (1). Moreover, in the case of etching a structure patterned with a material excluding the etching target material, accuracy in vertical processing is also improved.

When an etching target material is an oxygen-containing Si-based material, such as $SiO_2$, in a structure patterned with a material excluding the etching target material as mentioned above, it is preferable to use a compound represented by general formula (1) mixed with an etching gas, such as $CF_4$, $CHF_3$, $C_2F_6$, $C_3F_8$, $C_4F_8$, $C_4F_6$, or $C_5F_8$, in view of selective etching and etching with satisfactory accuracy in vertical processing. In particular, when a high selectivity is needed, it is preferable to mix with $C_4F_8$, $C_4F_6$, or $C_5F_8$ having a high C number.

When an etching target material is a nitrogen-containing Si-based material, such as SiN, in a structure patterned with a material excluding the etching target material, it is preferable to use, for plasma etching, a gas compound represented by general formula (1) mixed with a HFC gas, such as $CHF_3$, $CH_2F_2$, or $CH_3F$, in view of selective etching and etching with satisfactory accuracy in vertical processing. In particular, when a high selectivity is needed, it is also effective to use a HFC gas having a C number of 2 or more.

By adding at least one oxygen-containing compound selected from the group consisting of $O_2$, $O_3$, CO, $CO_2$, NO, $NO_2$, $SO_2$, and $SO_3$ to a composition containing a compound represented by general formula (1), the dry etching gas composition in the present invention can obtain the effects of suppressing excessive deposition (deposits), increasing the etching rate of an etching target, and enhancing the selectivity of the etching target over materials excluding the etching target.

In the dry etching gas composition in the present invention, at least one inert gas selected from the group consisting of $N_2$, He, Ar, Ne, and Xe may be added to the composition containing a compound represented by general formula (1). Among these inert gases, He, Ar, or Xe is preferably used.

Exemplary etching gas compositions used in the method of the present invention include the following.

(a) The method can be carried out using a compound represented by general formula (1) having a purity of 90 vol % or more, and the method is preferably carried out using the compound having a purity of 99 vol % or more and is particularly preferably carried out using the compound having a purity of 99.999 vol % or more.

(b) A dry etching composition used for etching preferably contains 1 to 100 vol % of a compound represented by general formula (1).

(c) A dry etching composition used for etching preferably contains, in addition to a compound represented by general formula (1), at least one selected from the oxygen atom-containing compound group consisting of $O_2$, $O_3$, CO, $CO_2$, NO, $NO_2$, $SO_2$, and $SO_3$. In particular, $O_2$ is preferably used. The proportion of the oxygen atom-containing compound is preferably 5 to 80% and particularly preferably 10 to 65% relative to the total amount of the compound represented by general formula (1) and the oxygen atom-containing compound.

(d) A dry etching composition used for etching preferably contains, in addition to a compound represented by general formula (1) as well as in addition to or in place of the above-mentioned oxygen atom-containing compound group, at least one selected from the inert gas group consisting of rare gases and $N_2$. In particular, Ar is preferably used. The proportion of an inert gas contained in the etching gas composition is preferably 1 to 80 vol % and particularly preferably 50 to 75 vol %.

As a dry etching apparatus used for dry etching in the present invention, any apparatus used in the technical field concerned can be used without particular limitation. For example, an apparatus of helicon wave mode, high frequency induction mode, parallel plate configuration mode, magnetron mode, microwave mode, or the like is usable.

The dry etching method in the present invention is for vertical processing of a fine pattern wafer of a Si-based material. Accordingly, the etching apparatus needs to be an apparatus suitable for ion-assisted etching and equipped with a vacuum chamber that can reproduce low gas pressure conditions. Under low pressure conditions, particles in a plasma tend to travel in straight line and ions for irradiating a substrate reach the substrate without being blocked by other particles. Consequently, such low pressure conditions are advantageous for vertical processing since ions incident normal to the substrate increase. In the dry etching method in the present invention, the pressure inside the vacuum chamber during etching is preferably adjusted to 100 Torr to 0.1 mTorr and further preferably adjusted to 100 mTorr to 0.1 mTorr.

In the dry etching method in the present invention, a compound represented by general formula (1) is preferably introduced as a gas into a vacuum chamber of an etching apparatus. For this reason, an etching apparatus used for the dry etching method in the present invention preferably includes a mechanism for introducing the compound represented by general formula (1) as a gas and further for adjusting the amount introduced. Moreover, regarding such a mechanism, since a plurality of gas compounds including a gas compound represented by general formula (1) and other gas compounds described above, such as $O_2$ and Ar, are effectively used depending on the purposes in the plasma etching method in the present invention, it is preferable to include four or more mechanisms for introducing gases and for adjusting the amounts introduced.

EXAMPLES

The present working examples (etching tests (1) and (2), deposit film evaluation test) used, as a plasma etching apparatus, a capacitively coupled plasma etching apparatus of parallel plate configuration from SAMCO Inc. The composition of a deposit film was determined by an SEM-EDX (scanning electron microscope/energy dispersive X-ray spectroscopy).

As a silicon oxide film ($SiO_m$; m is a natural number), a $SiO_2$ film deposited at a thickness of 1000 nm on a silicon wafer by plasma CVD was used. As a silicon nitride film (SiN), a SiN film deposited at a thickness of 300 nm on a silicon wafer by thermal CVD was used. As an amorphous carbon film (ACL), ACL deposited at a thickness of 400 nm on a silicon wafer by plasma CVD was used.

The flow rate of a gas was expressed in sccm (standard cc/min) under standard conditions of a temperature (0° C.) and a pressure (1 atm).

The sample film thickness during etching was measured using an interference-mode film thickness meter. The etching conditions are shown in Tables 1 and 3 below. The etching rate of a gas was calculated according to the following formula.

$$\text{Etching rate (nm/min)} = \frac{\text{sample film thickness before etching (nm)} - \text{sample film thickness after etching (nm)}}{\text{etching time (min)}} \quad [\text{Math. 1}]$$

The A/B selectivity was calculated according to the following formula.

A/B selectivity=etching rate of A film(nm/min)÷etching rate of B film(nm/min)

A deposition film (hereinafter, referred to as "deposit film") was formed on a bare silicon wafer. The deposit film thickness was measured by a scanning electron microscope. The conditions for forming a deposit film and for sputtering are shown in Table 2 below. The forming rate of a deposit film and the sputtering rate were calculated according to the following formulae.

$$\text{Deposition rate (nm/min)} = \frac{\text{deposit film thickness (nm)}}{\text{deposition time (min)}} \quad [\text{Math. 2}]$$

$$\text{sputtering rate (nm/min)} = \frac{\text{deposit film thickness of unsputtered sample (nm)} - \text{deposit film thickness of sputtered sample (nm)}}{\text{sputtering time (min)}} \quad [\text{Math. 3}]$$

[Etching Test (1)]

An etching test was performed under conditions shown in Table 1 for three samples in which $SiO_2$, SiN, or ACL had been deposited on each silicon wafer. For etching gases, perfluorocyclobutene (1,2,3,3,4,4-hexafluoro-1-cyclobutene ($C_4F_6$)) as a sulfur-free Comparative Example and 2,2,3,4,5,5-hexafluoro-2,5-dihydrothiophene ($C_4F_6S$) as a sulfur-containing Example of the present invention were used.

TABLE 1

| Etching Test Conditions (apparatus: SAMCO RIE-10NR) SAMCO RIE-10NR | |
|---|---|
| Total gas flow rate | 80 [sccm] |
| Ar/etching gas/$O_2$ | 40/x/y [sccm] |
| Pressure | 3.0 [Pa] |
| RF power | 300 [W] |

The test results are shown in FIG. 1. Ar was allowed to flow constantly at 40 sccm (50%) while varying the rate of an etching gas and the rate of oxygen ($O_2$). When the rate of an etching gas is 20 sccm and the rate of oxygen is 20 sccm, the $O_2$ ratio in the graphs of FIG. 1 is 50%. The measurement was started from this component ratio, and the concentration of oxygen in an etching gas composition was increased to the $O_2$ ratio of 65% in the graphs of FIG. 1 at which the rate of an etching gas is 14 sccm and the rate of oxygen is 26 sccm.

Since ACL comprises carbon, the etching rate increased with the increase in $O_2$ concentration in both the Example and the Comparative Example. Meanwhile, it was found that in the case of the etching gas ($C_4F_6S$) of the Example, the etching rate of $SiO_2$ sharply increased with the increase in $O_2$ ratio to reach the maximum (approximately 70 nm/min) at the $O_2$ ratio of 55% (etching gas rate of 18 sccm, oxygen rate of 22 sccm), whereas the etching rate increased gradually with the increase in $O_2$ ratio to reach almost the maximum (approximately 70 nm/min) at the $O_2$ ratio of 65% (etching gas rate of 14 sccm, oxygen rate of 26 sccm) in the Comparative Example. Moreover, it was also found that in the case of the etching gas ($C_4F_6S$) of the Example, the etching rate of SiN increased gradually with the increase in $O_2$ ratio to reach almost the maximum (approximately 55 nm/min) at the $O_2$ ratio of 65%, whereas the etching rate of SiN increased further gradually with the increase in $O_2$ ratio to reach less than 40 nm/min even at the $O_2$ ratio of 65% in the Comparative Example.

Regarding the results obtained in the Example and the Comparative Example, the etching rates of $SiO_2$ and SiN were evaluated relative to the etching rate of ACL. The results are shown in FIG. 2. FIG. 2 reveals the following. In the Comparative Example, when the oxygen concentration is relatively low at the $O_2$ ratio of 55% (etching gas rate of 18 sccm, oxygen rate of 22 sccm), only the etching rate of $SiO_2$ is high. Consequently, it is possible to selectively etch $SiO_2$ over SiN and ACL. Meanwhile, in the Example of the present invention, when the oxygen concentration is relatively low at the $O_2$ ratio of 55% (etching gas rate of 18 sccm, oxygen rate of 22 sccm), the etching rate of $SiO_2$ is further high and the etching rate of SiN is also high. Consequently, it is possible to etch both $SiO_2$ and SiN at higher etching rates than ACL. Further, it was also found that differences in etching rate between the Example and the Comparative Example disappear when the $O_2$ ratio exceeds 65%.

The foregoing results revealed that remarkable differences in etching behavior exist between the Example of the present invention, in which a sulfur-containing etching gas is used, and the Comparative Example, in which a sulfur-free etching gas is used. Accordingly, by utilizing the novel etching behavior of the present invention, it was found possible to achieve both high-speed etching and high selectivity over mask materials. The present Example enables selective etching of $SiO_2$ and/or SiN over ACL with significant differences from the Comparative Example. Moreover, by using the etching gas of the present invention in combination with a conventional etching gas, it is possible to change a difference in etching rate between $SiO_2$ and SiN, thereby making further accurate etching possible.

[Deposit Film Evaluation Test]

Etching of a target using an etching gas is in a competing relationship with deposition of decomposition products of the etching gas. During etching, such a deposit is also formed. By using perfluorocyclobutene (1,2,3,3,4,4-hexafluoro-1-cyclobutene ($C_4F_6$)) as a sulfur-free Comparative Example and 2,2,3,4,5,5-hexafluoro-2,5-dihydrothiophene ($C_4F_6S$) as a sulfur-containing Example of the present invention, a deposit of an etching gas was formed under conditions shown in Table 2 below, and the ease of the removal processing of the deposit by Ar sputtering was evaluated.

TABLE 2

Conditions for Deposit Film Evaluation Test
(apparatus: SAMCO RIE-200NL) SAMCO RIE-200NL

|  | Deposition rate | Sputtering rate |
| --- | --- | --- |
| Ar/etching gas | 10/20 [sccm] | 50/0 [sccm] |
| Pressure | 5.0 [Pa] | 5.0 [Pa] |
| RF power | 100 [W] | 100 [W] |
| Time | 120 [sec] | 30 [sec] |

The results of the deposit film evaluation test are shown in FIGS. 3 and 4. Both the deposition rate and the sputtering rate are lower in the Example of the present invention than in the Comparative Example. However, the lower ratio (SR/DR) of the sputtering rate (SR) to the deposition rate (DR) in the Example of the present invention revealed easier deposition and harder sputtering in the Example of the present invention. Such characteristics of the present invention are presumably attributable to a sulfur-containing film since sulfur is detected in the composition of the deposit film as shown in FIG. 4. From these test results, the etching gas of the present invention was found capable of etching deposited layers, such as $SiO_2$ and SiN, on a silicon wafer while forming a deposit film that is hard to remove. The novel behavior of the present invention like this is useful, for example, for protecting sidewalls or mask materials during etching.

[Etching Test (2)]

An etching test was performed under conditions shown in Table 3 for three samples in which $SiO_2$, SiN, or ACL had been deposited on each silicon wafer. For etching gases, perfluoropropene (1,1,2,3,3,3-hexafluoro-1-propene ($C_3F_6$)) as a sulfur-free Comparative Example and trifluorovinyl trifluoromethyl thioether ($C_3F_6S$) as a sulfur-containing Example of the present invention were used.

TABLE 3

Etching Test Conditions (2) (apparatus: SAMCO RIE-10NR) SAMCO RIE-10NR

| Ar/etching gas/$O_2$ | 50/20 (x)/**(y) [sccm] |
| --- | --- |
| Pressure | 10.0 [Pa] |
| RF power | 300 [W] |

The test results are shown in FIG. 5. Ar and an etching gas were allowed to flow constantly at rates of 50 sccm and 20 sccm, respectively, while varying the rate (sccm) of oxygen ($O_2$). The etching of ACL started at around over 20% of the rate of oxygen relative to the total (x+y) of an etching gas (x) and oxygen (y).

In the case of the etching gas ($C_3F_6S$) of the Example, the etching rate of $SiO_2$ sharply increased with the increase in $O_2$ ratio to reach the maximum (approximately 70 nm/min) at the $O_2$ ratio of near 25%. Meanwhile, in the Comparative Example ($C_3F_6$), the etching rate of $SiO_2$ hardly increased despite the increase in $O_2$ ratio and increased sharply at around the $O_2$ ratio of over 20%. Moreover, in the case of the etching gas ($C_3F_6S$) of the Example, the etching rate of SiN increased gradually with the increase in $O_2$ ratio to reach almost the maximum (approximately 55 nm/min) at around the $O_2$ ratio of over 30%. Meanwhile, in the Comparative Example, the etching rate of SiN hardly increased despite the increase in $O_2$ ratio and increased sharply at around the $O_2$ ratio of over 20%.

Regarding the results obtained in the Example and the Comparative Example, the etching rates of $SiO_2$ and SiN were evaluated relative to the etching rate of ACL. The results are shown in FIG. 6. FIG. 6 reveals the following. In the Comparative Example, when the oxygen concentration is relatively low at the $O_2$ ratio of 20% or less, all the etching rates of $SiO_2$, SiN, and ACL are low. Meanwhile, in the Example of the present invention, when the oxygen concentration is relatively low at the $O_2$ ratio of 20% or less, both the etching rates of $SiO_2$ and SiN are extremely high. Consequently, it is possible to etch both $SiO_2$ and SiN at higher etching rates than ACL. Moreover, it was also found that differences in etching rate between the Example and the Comparative Example disappear when the $O_2$ ratio exceeds 30%.

From the foregoing results, it was found in etching test (2) as well in the same manner as etching test (1) that remarkable differences in etching behavior exist between the Example of the present invention, in which a sulfur-containing etching gas is used, and the Comparative Example, in which a sulfur-free etching gas is used. In other words, it was found possible, by utilizing the novel etching behavior of the present invention, to achieve both high-speed etching and high selectivity over mask materials. The present Example enables selective etching of $SiO_2$ and/or SiN over ACL with significant differences from the Comparative Example. Moreover, by using the etching gas of the present invention in combination with a conventional etching gas, it is possible to change a difference in etching rate between $SiO_2$ and SiN, thereby making further accurate etching possible.

The invention claimed is:

1. A dry etching method, comprising etching a silicon-containing deposit or film by plasma etching with a dry etching gas composition consisting of: a sulfur-containing fluorocarbon compound that has an unsaturated bond and that is represented by general formula (1) of CxFySz wherein x, y, and z are 2≤x≤5, y≤2x, and 1≤z≤2, and
optionally, at least one compound selected from the group consisting of:
at least one oxygen-containing compound selected from the group consisting of $O_2$, $O_3$, CO, $CO_2$, NO, $NO_2$, $SO_2$, and $SO_3$;
at least one inert gas;
at least one fluorocarbon (FC); and
at least one hydrofluorocarbon (HFC).

2. The dry etching method according to claim 1, wherein the silicon containing deposit or film is a deposit or film further containing oxygen and/or nitrogen.

3. The dry etching method according to claim 1, comprising selectively etching the silicon-containing deposit or film over a mask material.

4. The dry etching method according to claim 1, wherein etching is performed by generating a plasma of the etching gas composition to form S-containing ions or active species.

5. The dry etching method according to claim 1, wherein the sulfur-containing fluorocarbon compound is

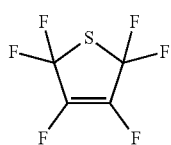
[Chem. 1]

2,2,3,4,5,5-Hexafluoro-2,5-dihydrothiophene

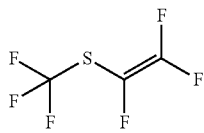
[Chem. 2]

Trifluorovinyl trifluoromethyl thioether

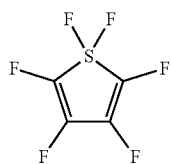
[Chem. 3]

1,1,2,3,4,5-Hexafluoro-1,1-dihydrothiophene

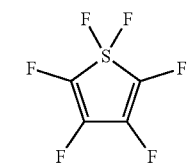
[Chem. 4]

2,3-Bis(trifluoromethyl)thiirene

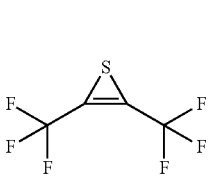
[Chem. 6]

2,2,3,3,4,5-Hexafluoro-2,3,-dihydrothiophene

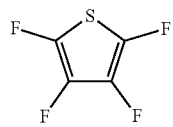
[Chem. 12]

2,3,4,5-Tetrafluorothiophene ($C_4F_4S$), or mixture thereof.

6. The dry etching method according to claim 1, wherein the at least one inert gas is selected from the group consisting of Na, He, Ar, Ne, and Xe.

7. The dry etching method according to claim 1, wherein the at least one fluorocarbon (FC) is selected from the group consisting of $CF_4$, $C_2F_6$, $C_3F_8$, $C_4F_8$, $C_4F_6$, and $C_5F_8$.

8. The dry etching method according to claim 1, wherein the at least one hydrofluorocarbon (HFC) is selected from the group consisting of $CHF_3$, $CH_2F_2$, and $CH_3F$.

9. The dry etching method according to claim 1, wherein the dry etching gas composition consists of:

the sulfur-containing fluorocarbon compound being

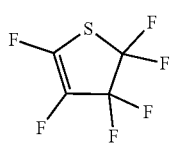
[Chem. 1]

2,2,3,4,5,5-Hexafluoro-2,5-dihydrothiophene, and the at least one inert gas being Ar.

10. The dry etching method according to claim 1, wherein the dry etching gas composition consists of:

the sulfur-containing fluorocarbon compound being

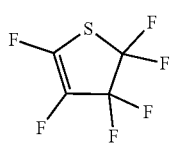
[Chem. 1]

2,2,3,4,5,5-Hexafluoro-2,5-dihydrothiophene, the at least one oxygen-containing compound being $O_2$; and the at least one inert gas being Ar.

11. The dry etching method according to claim 1, wherein the sulfur-containing fluorocarbon compound is

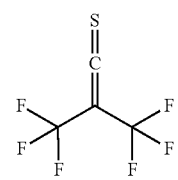
[Chem. 5]

3,3,3-Trifluoro-2-(trifluoromethyl)-1-propene-1-thione,

[Chem. 7]

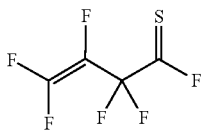

2,2,3,4,4-Pentafluoro-3-butenethioyl fluoride,

[Chem. 8]

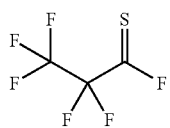

2,2,3,3,3-Pentafluoropropanethioyl fluoride,

[Chem. 9]

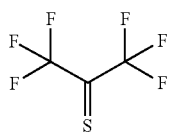

1,1,1,3,3,3-Hexafluoro-2-propanethione,

[Chem. 11]

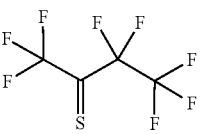

1,1,1,3,3,4,4,4-Octafluoro-2-butanethione, or mixture thereof.

12. The dry etching method according to claim 1, wherein the sulfur-containing fluorocarbon compound is

[Chem. 10]

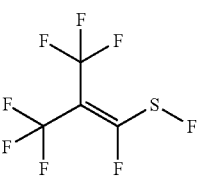

1,3,3,3-Tetrafluoro-2-(trifluoromethyl)-1-propene-1-sulfenyl fluoride.

13. A dry etching method, comprising plasma etching, with a dry etching gas composition consisting of: a sulfur-containing fluorocarbon compound that has an unsaturated bond and that is represented by general formula (1) of CxFySz wherein x, y, and z are 2≤x≤5, y≤2x, and 1≤z≤2, and optionally, at least one compound selected from the group consisting of:
at least one oxygen-containing compound selected from the group consisting of $O_2$, $O_3$, CO, $CO_2$, NO, $NO_2$, $SO_2$, and $SO_3$;
at least one inert gas;
at least one fluorocarbon (FC); and
at least one hydrofluorocarbon (HFC),
a stacked structure of: (a1) carbon-containing silicon-based film, (a2) a single crystal silicon film, (a3) an amorphous silicon film, (a4) a polycrystalline silicon film (polysilicon film), (a5) a silicon oxynitride film, (a6) an amorphous carbon film, and/or (a7) a photoresist film; and (b1) a silicon oxide film and/or (b2) a silicon nitride film, thereby selectively etching (b1) the silicon oxide film and/or (b2) the silicon nitride film of the stacked structure.

14. The dry etching method according to claim 13, wherein the stacked structure contains (b1) the silicon oxide film and (b2) the silicon nitride film; and the method selectively etches (b1) the silicon oxide film over (b2) the silicon nitride film.

15. The dry etching method according to claim 13, wherein etching is performed by generating a plasma of the etching gas composition to form S-containing ions or active species.

16. The dry etching method according to claim 13, wherein etching by the dry etching gas composition is performed under plasma conditions that enable simultaneous etching of (b1) a silicon oxide film and (b2) a silicon nitride film.

17. A dry etching method, comprising plasma etching, with a dry etching gas composition consisting of: a sulfur-containing fluorocarbon compound that has an unsaturated bond and that is represented by general formula (1) of $C_xF_yS_z$ wherein x, y, and z are 2≤x≤5, y≤2x, and 1≤z≤2, and optionally, at least one compound selected from the group consisting of:
at least one oxygen-containing compound selected from the group consisting of $O_2$, $O_3$, CO, $CO_2$, NO, $NO_2$, $SO_2$, and $SO_3$;
at least one inert gas;
at least one fluorocarbon (FC); and
at least one hydrofluorocarbon (HFC),
a stacked structure of: (a1) a carbon containing silicon-based film, (a2) a single crystal silicon film, (a3) an amorphous silicon film, (a4) a silicon nitride film, (a5) a silicon oxynitride film, (a6) an amorphous carbon film, and/or (a7) a photoresist film; and (b1) a silicon oxide film and/or (b2) a polycrystalline silicon film (polysilicon film), thereby selectively etching (b1) the silicon oxide film and/or (b2) the polycrystalline silicon film (polysilicon film) of the stacked structure.

18. The dry etching method according to claim 17, wherein etching is performed by generating a plasma of the etching gas composition to form S-containing ions or active species.

* * * * *